(12) United States Patent  (10) Patent No.: US 7,030,343 B2
Tran  (45) Date of Patent: Apr. 18, 2006

(54) CONTROLLER SYSTEM FOR BATHING INSTALLATION

(75) Inventor: Trong Tran, Huntington Beach, CA (US)

(73) Assignee: Balboa Instruments, Inc., Tustin, CA (US)

( * ) Notice: Subject to any disclaimer, the term of this patent is extended or adjusted under 35 U.S.C. 154(b) by 209 days.

(21) Appl. No.: 10/677,510

(22) Filed: Oct. 2, 2003

(65) Prior Publication Data

US 2004/0070911 A1    Apr. 15, 2004

Related U.S. Application Data

(60) Provisional application No. 60/415,982, filed on Oct. 3, 2002.

(51) Int. Cl.
*H05B 3/02*    (2006.01)
(52) U.S. Cl. .................. 219/483; 219/494; 219/497; 219/481; 361/722; 361/630
(58) Field of Classification Search ................ 219/497, 219/494, 483–486, 481, 506, 517, 519; 307/11, 307/38–42, 47, 117; 439/92, 95, 101; 361/720, 361/722, 748, 730, 752, 630, 627, 833, 781, 361/791
See application file for complete search history.

(56) References Cited

U.S. PATENT DOCUMENTS

| | | | |
|---|---|---|---|
| 3,528,548 A | 9/1970 | Scheckler | |
| 3,616,915 A | 11/1971 | Whitlock | |
| 3,781,925 A | 1/1974 | Curtis et al. | |
| 4,016,079 A | 4/1977 | Severin | |
| 4,115,263 A | 9/1978 | James | |
| 4,200,910 A | 4/1980 | Hall | |
| 4,209,837 A | 6/1980 | Brown | |
| 4,224,154 A | 9/1980 | Steininger | |
| 4,233,694 A | 11/1980 | Janosko et al. | |
| 4,235,368 A | 11/1980 | Neel | |
| 4,257,555 A | 3/1981 | Neel | |
| 4,267,966 A | 5/1981 | Neel et al. | |
| 4,292,542 A * | 9/1981 | Bajka ........................ | 307/28 |
| 4,298,946 A | 11/1981 | Hartsell et al. | |
| 4,300,199 A | 11/1981 | Yoknis et al. | |
| 4,308,991 A | 1/1982 | Peinetti et al. | |
| 4,322,297 A | 3/1982 | Bajka | |
| 4,344,000 A | 8/1982 | Schornack et al. | |
| 4,361,274 A | 11/1982 | Raleigh et al. | |
| 4,368,549 A | 1/1983 | Ramey | |
| 4,385,357 A | 5/1983 | Davis et al. | |
| 4,385,724 A | 5/1983 | Ramsauer et al. | |
| 4,393,527 A | 7/1983 | Ramey | |
| 4,398,789 A | 8/1983 | Pryor | |

(Continued)

*Primary Examiner*—Mark Paschall
(74) *Attorney, Agent, or Firm*—Larry K. Roberts

(57) ABSTRACT

A controller system for a bathing installation such as a spa is disclosed. The system distributes line voltage from a line voltage service to one or more line voltage loads and controls operation of a service system for the bathing installation. The system includes a housing structure, with a controller printed circuit board mounted within the housing. The board includes a plurality of line voltage output terminals for connection to respective line voltage loads via line voltage wiring connections, a set of circuit board line voltage contact surfaces, a plurality of circuit conductors for providing circuit connections between the contact surfaces and respective ones of the line voltage from the circuit board line voltage contact surfaces to the output terminals.

42 Claims, 8 Drawing Sheets

U.S. PATENT DOCUMENTS

| | | | |
|---|---|---|---|
| 4,403,157 A | 9/1983 | Guajardo et al. | |
| 4,404,697 A | 9/1983 | Hatcher | |
| 4,409,694 A | 10/1983 | Barrett, Sr. et al. | |
| 4,421,270 A | 12/1983 | Raleigh et al. | |
| 4,564,962 A | 1/1986 | Castleberry et al. | |
| 4,570,216 A | 2/1986 | Chan | |
| 4,621,613 A | 11/1986 | Krumhansl | |
| 4,676,914 A | 6/1987 | Mills et al. | |
| 4,685,158 A | 8/1987 | Lively | |
| 4,742,456 A | 5/1988 | Kamena | |
| 4,763,365 A * | 8/1988 | Gerondale et al. | 4/493 |
| 4,773,008 A | 9/1988 | Schroeder et al. | |
| 4,780,917 A * | 11/1988 | Hancock | 4/541.2 |
| 4,828,626 A | 5/1989 | Meincke | |
| RE32,960 E | 6/1989 | Levine | |
| 4,844,333 A * | 7/1989 | Davis et al. | 236/51 |
| 4,851,708 A | 7/1989 | Palmer | |
| 4,854,498 A | 8/1989 | Stayton | |
| 4,941,608 A | 7/1990 | Shimizu et al. | |
| 4,967,382 A | 10/1990 | Hall | |
| 5,079,784 A | 1/1992 | Rist et al. | |
| 5,117,233 A | 5/1992 | Hamos et al. | |
| 5,175,047 A | 12/1992 | McKenney et al. | |
| 5,208,923 A | 5/1993 | Stiver | |
| 5,226,408 A | 7/1993 | Drysdale | |
| 5,245,221 A | 9/1993 | Schmidt et al. | |
| 5,278,455 A | 1/1994 | Hamos | |
| 5,311,451 A | 5/1994 | Barrett | |
| 5,329,991 A | 7/1994 | Mehta et al. | |
| 5,381,954 A | 1/1995 | Tokizaki | |
| 5,415,221 A | 5/1995 | Zakryk | |
| RE35,018 E | 8/1995 | Homan | |
| 5,457,826 A | 10/1995 | Haraga et al. | |
| 5,548,854 A | 8/1996 | Bloemer et al. | |
| 5,585,025 A | 12/1996 | Idland | |
| 5,616,239 A | 4/1997 | Wendell et al. | |
| 5,628,896 A | 5/1997 | Klingenberger | |
| 5,682,754 A | 11/1997 | Groenewold | |
| 5,684,717 A | 11/1997 | Beilfuss et al. | |
| 5,708,548 A | 1/1998 | Greeve et al. | |
| 5,730,861 A | 3/1998 | Sterghos et al. | |
| 5,804,080 A | 9/1998 | Klingenberger | |
| 5,809,796 A | 9/1998 | Zakryk | |
| 6,109,050 A | 8/2000 | Zakryk | |
| 6,282,370 B1 | 8/2001 | Cline et al. | |
| 6,407,469 B1 * | 6/2002 | Cline et al. | 307/11 |

* cited by examiner

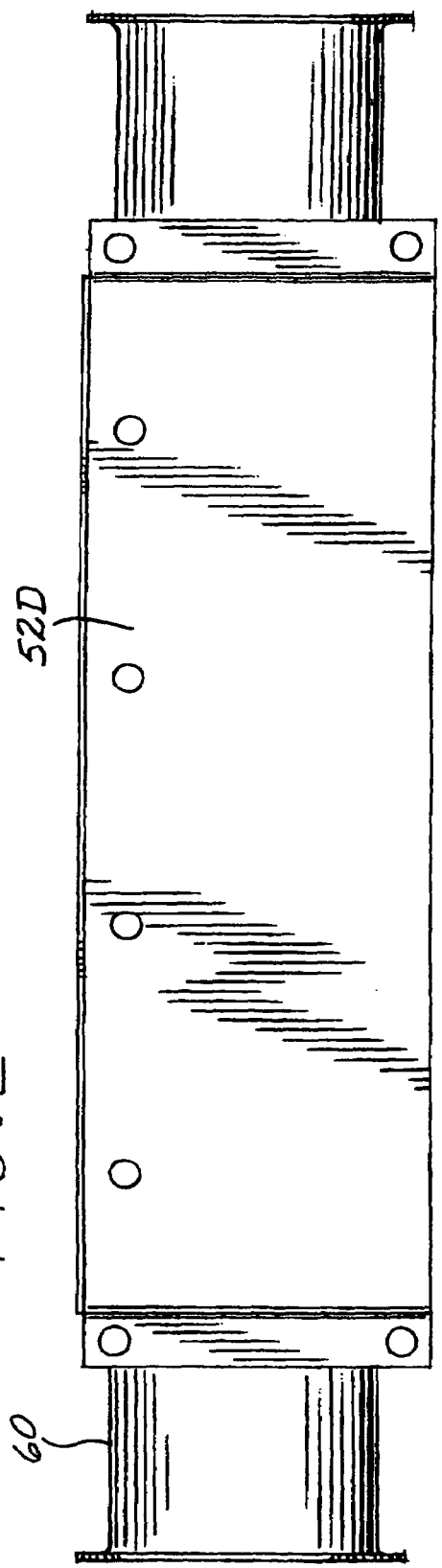
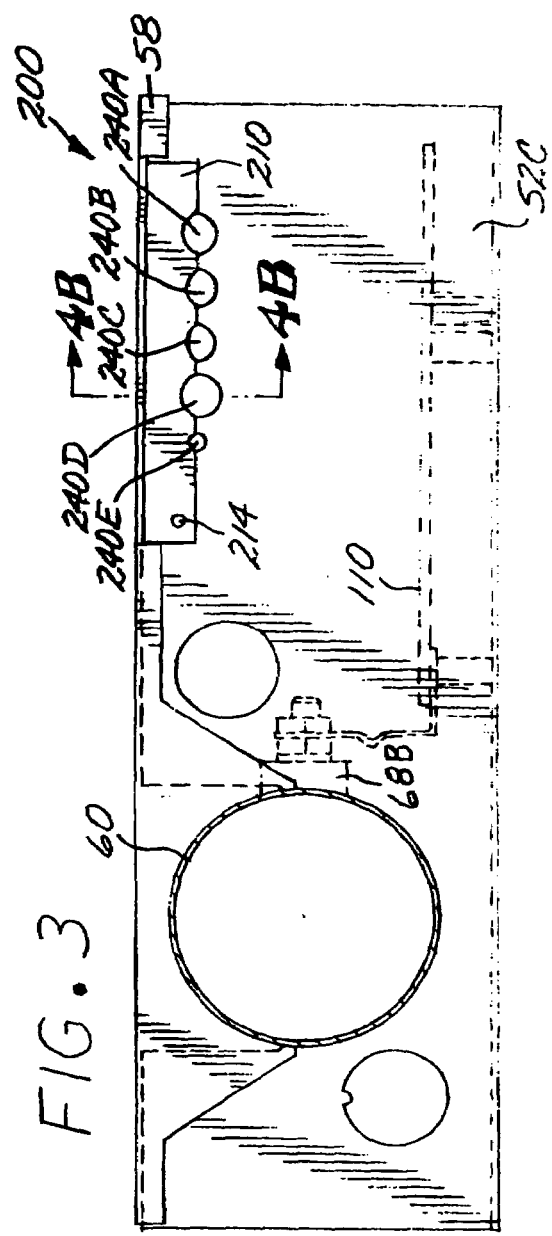

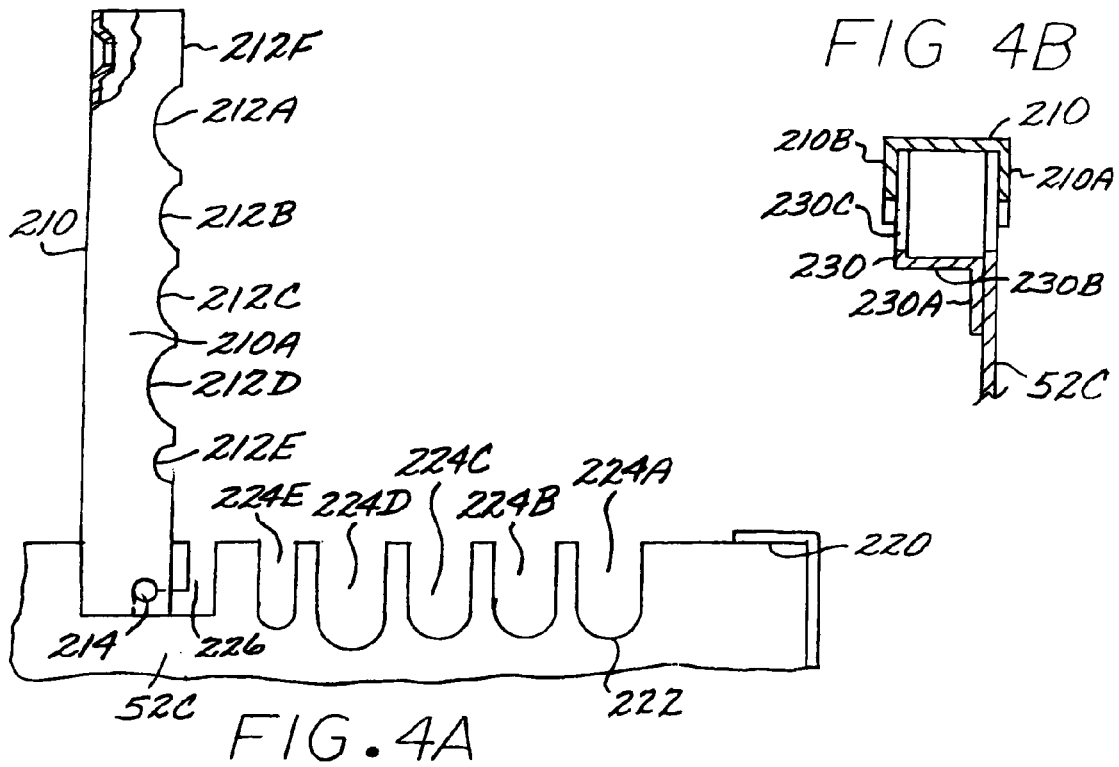
FIG. 4A
FIG 4B
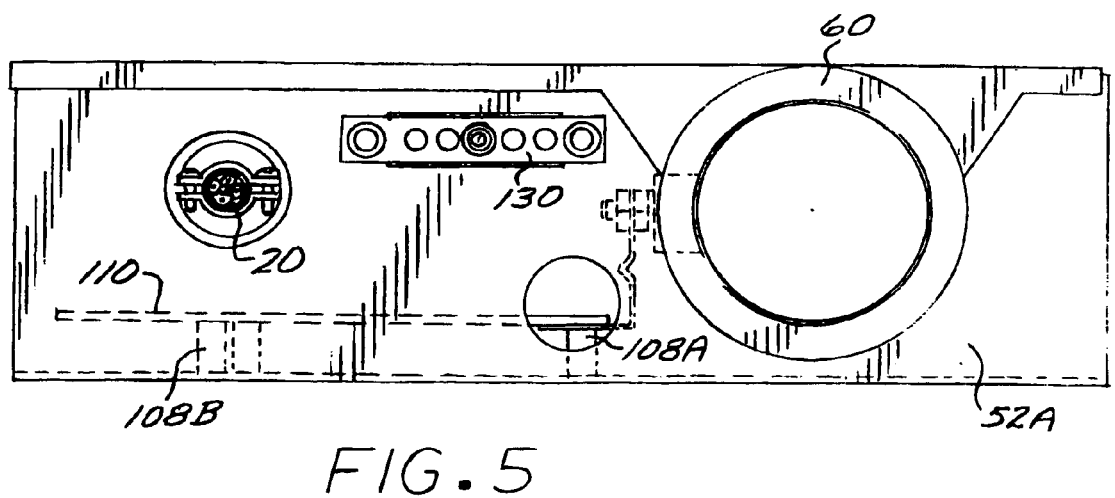
FIG. 5

CONTROLLER SYSTEM FOR BATHING INSTALLATION

This application claims the benefit of U.S. Provisional Application 60/415,982, filed Oct. 3, 2002, the entire contents of which are incorporated herein by this reference.

BACKGROUND

Electronic control systems have been employed to control various functions of a bathing installation such as a pool or spa. A problem associated with installation and maintenance of the control systems has been the need to make numerous wiring connections in the factory and in the field when installing the control system. These wiring connections include line voltage wiring connections, low voltage wiring connections, and connections for the power hookups for the different components associated with the pool or spa, which typically have been run through circuit breakers in a main or auxiliary panel to the various components, such as the pump, heater and lights. This is a time consuming task, and one which can lead to wiring mistakes, in view of the number of wiring connections which need to be made.

BRIEF DESCRIPTION OF THE DRAWING

Features and advantages of the present invention will be apparent from the following detailed description of an exemplary embodiment thereof, as illustrated in the accompanying drawings, in which:

FIG. 2 is a left side view of the system of FIG. 1A.

FIG. 3 is a bottom side view of the system of FIG. 1A, taken in the direction of arrows 3 in FIG. 1A.

FIG. 4A is an enlarged view of a portion of FIG. 3, showing an exemplary embodiment of a strain relief clamp of the enclosure housing structure.

FIG. 4B is a cross-sectional view taken along line 4B—4B of FIG. 4A showing the clamp structure in further detail.

FIG. 5 is an upper side view of the system of FIG. 1A, taken in the direction of arrows 5 in FIG. 1A.

DETAILED DESCRIPTION

OVERVIEW

A controller system for a bathing installation such as a spa is disclosed. In an exemplary embodiment, the system distributes line voltage from a line voltage service to one or more line voltage loads and controls operation of a service system for the bathing installation. The system includes a housing structure, with a controller printed circuit board mounted within the housing. The board includes a plurality of line voltage output terminals for connection to respective line voltage loads via line voltage wiring connections, a set of circuit board line voltage contact surfaces, a plurality of circuit conductors for providing circuit connections between the contact surfaces and respective ones of the line voltage output surfaces. The controller circuit board assembly routes line voltage from the circuit board line voltage contact surfaces to the output terminals. In an exemplary embodiment, a line voltage connector structure is non-removably mounted on the circuit board, and has a set of line voltage connectors, each including a connector for connection of a corresponding one of a set of line voltage service conductor and a connector line voltage conductor pin soldered to a board line voltage contact surface.

In an exemplary embodiment, a plurality of line voltage load connectors are non-removably mounted on the circuit board, each including a set of terminals for connection to line voltage load wiring and a set of pins soldered to respective ones of the line voltage output surfaces.

In an exemplary embodiment, a wiring strain relief clamp structure is formed with the housing, to provide strain relief for wiring sets leading to external devices. Ground connections in the embodiment are simplified by use of a ground wire connection to the housing structure, with electrical continuity provided between the printed circuit board and the housing by conductive standoff elements. A jumper wire configuration allows the line voltage connectors to be connected to either 120V or 240V service.

EXEMPLARY EMBODIMENT(S)

Figure 1A:
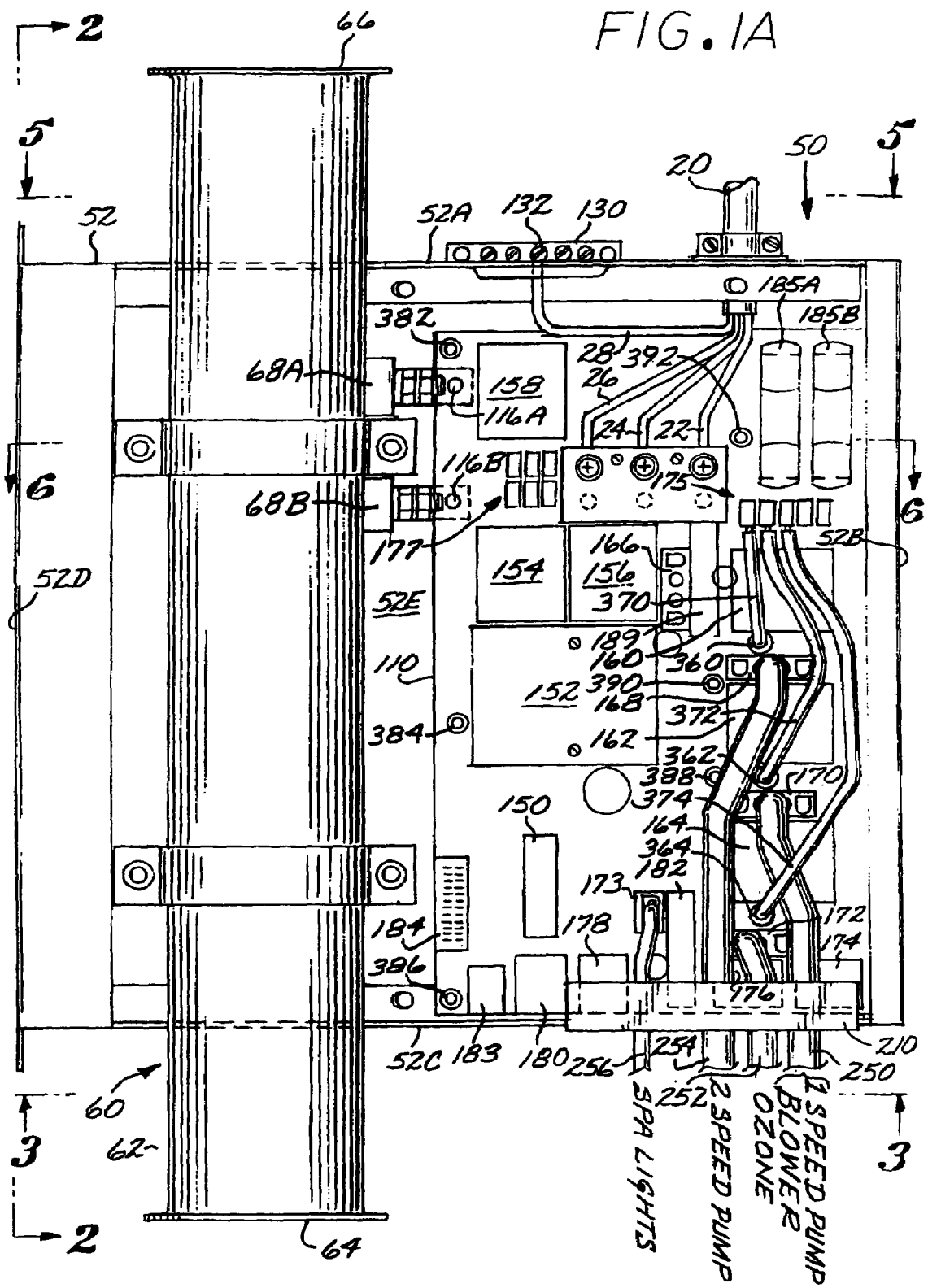
FIG. 1A is a top plan view of an exemplary embodiment of an integrated water heater and electronic control system (with top cover removed) for a bathing installation such as a spa installation.

An exemplary embodiment of an integrated water heater and electronic control system 50 for a spa installation is shown in the top plan view of FIG. 1A. The system includes an enclosure housing 52, shown in this embodiment as a rectangular housing structure having side walls 52A, 52B, 52C, 52D and bottom wall 52E. The housing also typically includes a removable cover 58 (FIG. 3). The housing is typically fabricated of an electrically conductive material such as sheet metal or aluminum.

The system 50 includes a water heater assembly 60, which is secured to the enclosure housing. The heater assembly 60 has a heater shell 62, most usually made of metal, but can also be constructed of conductive plastic or of plastic with an internal metallic ground plate. Confined within the heater shell is a heater element, constructed to provide insulation from the water as generally known in the art. Power is provided to the heater element power terminals 68A, 68B from connection points 116A and 116B on the printed circuit board 110. This power is provided responsively to the programmed temperature provided to the electronic control system through a control panel (not shown) as is generally known. In this exemplary embodiment, the heater housing 62 is tubular in shape, and has a water inlet 64 and a water outlet 66. Other housing shapes can alternatively be employed. Located close to each end of the heater element in an exemplary embodiment are temperature sensor assemblies (not shown). A heater assembly suitable for the purpose is described more fully in commonly owned U.S. Pat. No. 6,282,370 B1,the entire contents of which are incorporated herein by this reference.

Ends of the heater assembly 60 are passed through openings formed in the opposed sidewalls 52A, 52C of the housing enclosure, so that the inlet and outlet ports are positioned outside the enclosure. The heater ports are connected via flanges to pipes comprising a water recirculation path to allow water in the spa to be pumped through the path and through the heater to heat the water and then return the heated water to the body of water in the spa.

Figure 6:
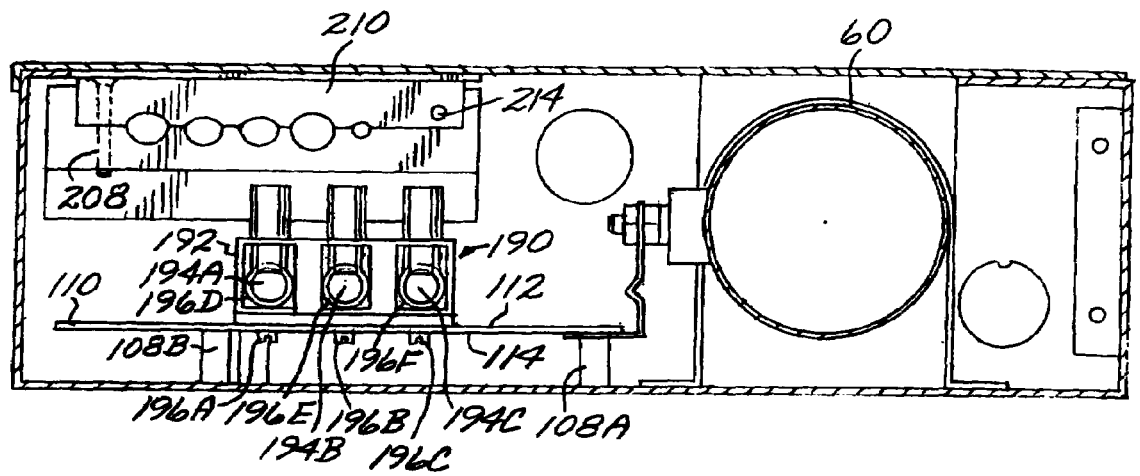
FIG. 6 is a simplified cross-sectional view of the system of FIG. 1A, taken along line 6—6 of FIG. 1A.

The system 50 further includes an electronic controller circuit assembly 100, comprising a main printed circuit board (PCB) 110 mounted in the enclosure housing on standoffs such as electrically conductive standoffs 108A, 108B (FIG. 6). Threaded fasteners attach the board to the respective standoffs for this exemplary embodiment, which have threaded bores formed therein. The circuit board 110 in this exemplary embodiment has a top surface 112 and a bottom surface 114, and each surface has defined therein a conductor pattern for interconnecting the circuit elements with which the board is populated, as will be described more fully below.

Figure 1B:
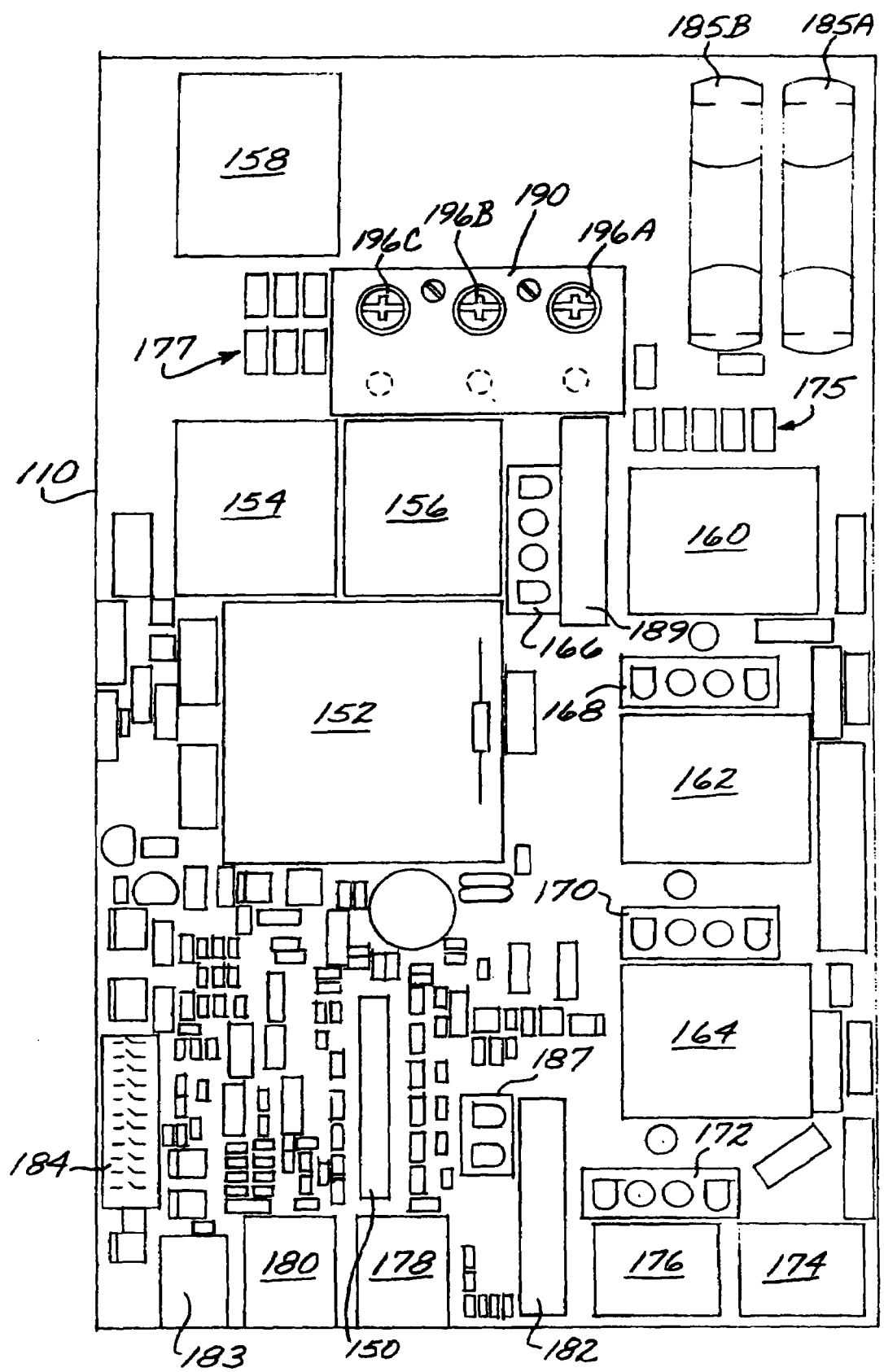
FIG. 1B is a diagrammatic illustration of elements populating the printed circuit board of the system of FIG. 1A.

The circuit elements mounted on the top surface 112 of the circuit board 110 include the following elements, schematically illustrated in FIG. 1A and 1B:

150 microprocessor
152 low voltage transformer
154 heater relay output
156 hi-limit relay for heater output
158 hi-limit relay for heater output
160 circulation pump relay
162 circulation pump relay
164 blower relay
166 wiring connector for circulation pump line voltage connection
168 wiring connector for pump line voltage connection
170 wiring connector for blower line voltage connection
172 wiring connector for relays 174, 176
174 relay for ozone generator output
176 relay for spa lights (12 V or 120 V spa light output)
178 panel 1 connector (wiring to first control panel)
180 panel 2 connector (wiring to second control panel)
182 fuse for spa lights
183 advanced diagnostic control and monitoring connector
184 dip switch
185A, 185B branch circuit fuses (line voltage)
187 connector (spa light output)
189 primary fuse to transformer
190 terminal block for line voltage supply conductors In addition to the foregoing devices, the circuitry on the top surface includes various discrete elements such as resistors and capacitors, as well as logic devices.

One feature is the PCB-mounted terminal block 190 for the supply voltage connectors. The terminal block 190 is shown in further detail in FIG. 6, and includes a body 192 fabricated of an electrical insulator. Receptacles 194A, 194B, 194C are provided for each of the three line voltage supply lines, respectively the white neutral conductor 22, and the black and red "hot" conductors 24, 26. The ground conductor 28 is connected separately in this exemplary embodiment, as will be discussed below. In this exemplary embodiment, the conductors 22, 24, 26 are secured in their corresponding receptacles by pressure connectors comprising threaded posts 196A, 196B, 196C which thread into corresponding threaded bores formed in metal cylinders 196D, 196E, 196F. The posts are tightened by a screwdriver to clamp the respective conductors against conductive clamp surfaces provided by the cylinders. Pins extend from the cylinders through holes formed in the body 192 and through via holes formed in the PCB, and are soldered in place to secure the terminal block in position and make electrical contact with respective conductor patterns formed on the bottom surface of the PCB. The terminal block is mechanically secured to the PCB by fasteners. Alternatively, other types of connectors can be employed to electrically connect the supply line conductors to the printed circuit board.

Since the terminal block 190 is non-removably mounted during fabrication, the connection of the line voltage conductors to the system 100 is simplified. In this exemplary embodiment, the installer need only use a screw driver to clamp the three supply conductors in place, and make the supply connections. Supply voltage is thus supplied to the PCB 110, which is fabricated with conductor patterns to distribute the line voltage to various circuit elements on the PCB 110, including switching devices such as relays, SCRs, and the like.

Terminal blocks suitable for the purpose are commercially available, e.g. the 438-3PCB model terminal block marketed by LMI Components, Inc., Boco Raton, Fla.

Another feature of the exemplary system 50 is the use of PCB-mounted power switching devices and wiring connectors, reducing the cost of the system as well as the time required for assembly of the system. In this exemplary embodiment, the spa heater, blower, circulation pump and water pump are all line voltage loads, and spa lights provide a low voltage load. Power for these loads is distributed by the PCB from the supply conductors, through appropriate line voltage fusing elements 184A, 184B and low voltage fusing elements 182 (FIG. 1A) and relays 154–164), which are mounted on the PCB. External wiring from these loads to the PCB are connected to connectors 168, 170, 172, 173 mounted to the PCB. In this exemplary embodiment, the external wiring includes wiring sets 250, 252, 254, 256, with wiring set 250, 252 running to a pump or blower, 254 running to an ozone generator, wiring set 254 running to a two speed pump, and 256 running to the spa lights. The connectors have connector terminals soldered to appropriate pads on the PCB for making connections to the supply voltage conductors fabricated on the bottom surface of the PCB 100. Suitable connectors for the purpose are commercially available, e.g. the 643416-1 or 643416-2 model 4-pin connectors for line voltage connectors 166, 168, 170, 172, and the 643412-1 or 643412-2 2-pin connectors for low voltage connector 187, marketed by AMP.

A strain relief clamp structure 200 is integrated with the housing enclosure 52, and is shown in detail in FIGS. 4A–4B. In an exemplary embodiment, the clamp structure 200 includes a hinged clamp member 210 mounted to the side wall 52C, and having a generally U-shaped cross-sectional configuration. The clamp member 210 has a series of rounded relieved areas defined on each leg portion 210A, 210B, including relieved areas 212A–212E formed in edge 212F of leg portion 210A (FIG. 4A). An internal shelf structure 230 is attached to the inner surface of wall 52C, e.g. by rivets, welding, gluing or other fastening means. The structure 230 thus includes a wall portion 230A in contact with the inner surface of wall 52C, a shelf portion 230B having a width to set the spacing distance between wall 52C and inner wall portion 230C of the structure 230. The top edges of the wall 52C and the inner wall portion 230C have formed therein a series of rounded slots or channels of corresponding width and spacing to match with the relieved areas formed in the clamp structure 210 when pivoted to a closed position. For example, wall 52C has formed in its top edge 222 a series of rounded slots 224A–224E as shown in FIG. 4A, and wall portion 230C has a series of rounded slots formed in its top edge. The clamp structure 210 has a pivot pin 214 running between the two leg portions 210A, 210B at an end thereof. The side wall 52C and inner wall portion 230C have formed in the top edges thereof a dogleg channel such as channel 226, which received the pivot pin and provides surfaces allowing the clamp structure 210 to pivot from the open position of FIG. 4A to the closed position of FIGS. 3 and 4B. Sets of insulated line voltage wiring are positioned in the slots formed in the side wall 52C and wall portion 230C, with the clamp 210 in the open position. Thereafter, the clamp 210 is pivoted to the closed position to clamp the conductors in place, providing strain relief for the conductors, without requiring the cost and space for a separate strain relief structure inside the housing.

With the clamp member 210 in the closed position, the clamp structure 200 defines a plurality of wiring openings 240A–240E, which can be of various sizes tailored to the diameter of the wiring set passed through each opening to ensure clamping pressure is brought to bear on the wiring sets. For example, openings 20A–240D can be sized for line voltage wiring sets 250–254, with 240D having a larger diameter than openings 240A–240C to received a wiring set having wires of larger gauge. Opening 240E can be sized for a low voltage wiring set, of smaller diameter, and in this embodiment receives wiring set 256, a low voltage wiring set for the spa lights.

A threaded fastener 208 (FIG. 6) is secured between the clamp structure to the shelf portion 230B to hold the clamp 210 in the closed position. The cover 58 (FIG. 3) is thereafter secured to the housing 52.

An earth ground 28 for the supply voltage is connected directly to a receptacle 132 on a ground terminal block 130 (FIG. 1A) mounted to the housing 52. The terminal block is fabricated of electrically conductive material, and includes a plurality of wiring receptacles, each with a pressure connector to secure a wire conductor in place. With the PCB 110 mounted to the housing by electrically conductive standoff elements, such as standoffs 108A, 108B, each of which is in contact with a ground pad on the lower surface 114 of the PCB, continuity is provided between the earth ground connection and the PCB. This simplifies the ground connection. Typically in the past, the ground connection is made to a terminal lug mounted to the floor of the housing structure, and then another ground conductor is connected between the terminal lug and each connector on the PCB or within the housing. Exemplary locations for the standoffs and PCB ground pads are shown in FIG. 1A, as 382–92. In this embodiment, a PCB ground pad is positioned adjacent each load connector 166–172, and is connected to a ground terminal on the adjacent connector through a PCB conductor, although for other applications, the connectors can share ground pads.

Figure 7:
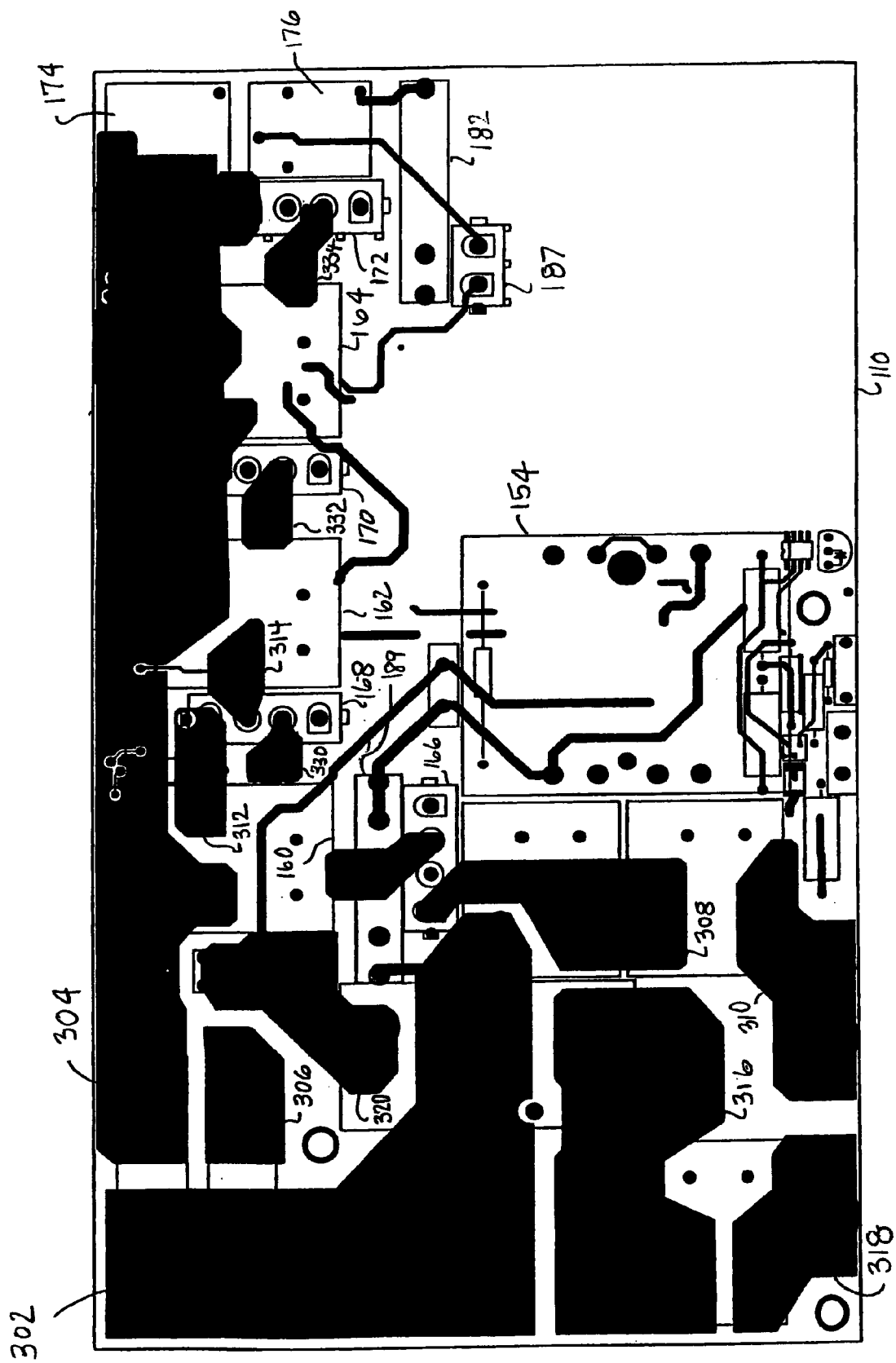
FIG. 7 is a top view of an exemplary embodiment of a component side of the printed circuit board of FIG. 1B in an unpopulated state, showing an illustrative line voltage conductor pattern.

FIG. 7 is an illustration of an exemplary, simplified conductor pattern formed on the upper, component surface 112 of the PCB 110. FIG. 7 shows the line voltage conductor pattern in heavy dark areas and lines, and for clarity omits much of the low voltage conductor patterns used for control signals and the like. Lighter black lines indicate some components mounted to the PCB, particularly the connectors, relays and transformers; these are indicated by the corresponding reference numbers as used in FIGS. 1A–6. The top surface line voltage conductor pattern is covered by a solder mask, not shown. Conductor areas 302, 304, 306, 308, 310, 312 and 314 are all electrically connected to the connector 196 for the black supply conductor 24, and thus are all held to the black supply conductor potential. Conductor areas 316,318 are each electrically connected to the connector 198 for the red supply conductor 26, and thus are held to the red supply potential. Conductor area 320 is electrically connected to the connector 194 for the white, neutral conductor 22, and thus is held to the neutral potential. The "black" conductor areas provide surfaces to which the relays, connectors and the transformer can be electrically connected. For example, area 304 provides conductor surface locations for connection to relays 160, 62 and 164, and as well for connectors 168, 170, 172. Area 310 provides a "black" conductor surface location for connecting to the heater. Similarly, the "red" conductor areas provide conductor locations for connecting to the heater ("red" area 318), for example, to provide 240V supply for the heater. The white conductor areas provide conductors locations for connecting to devices to provide 120V supply.

Figure 8:
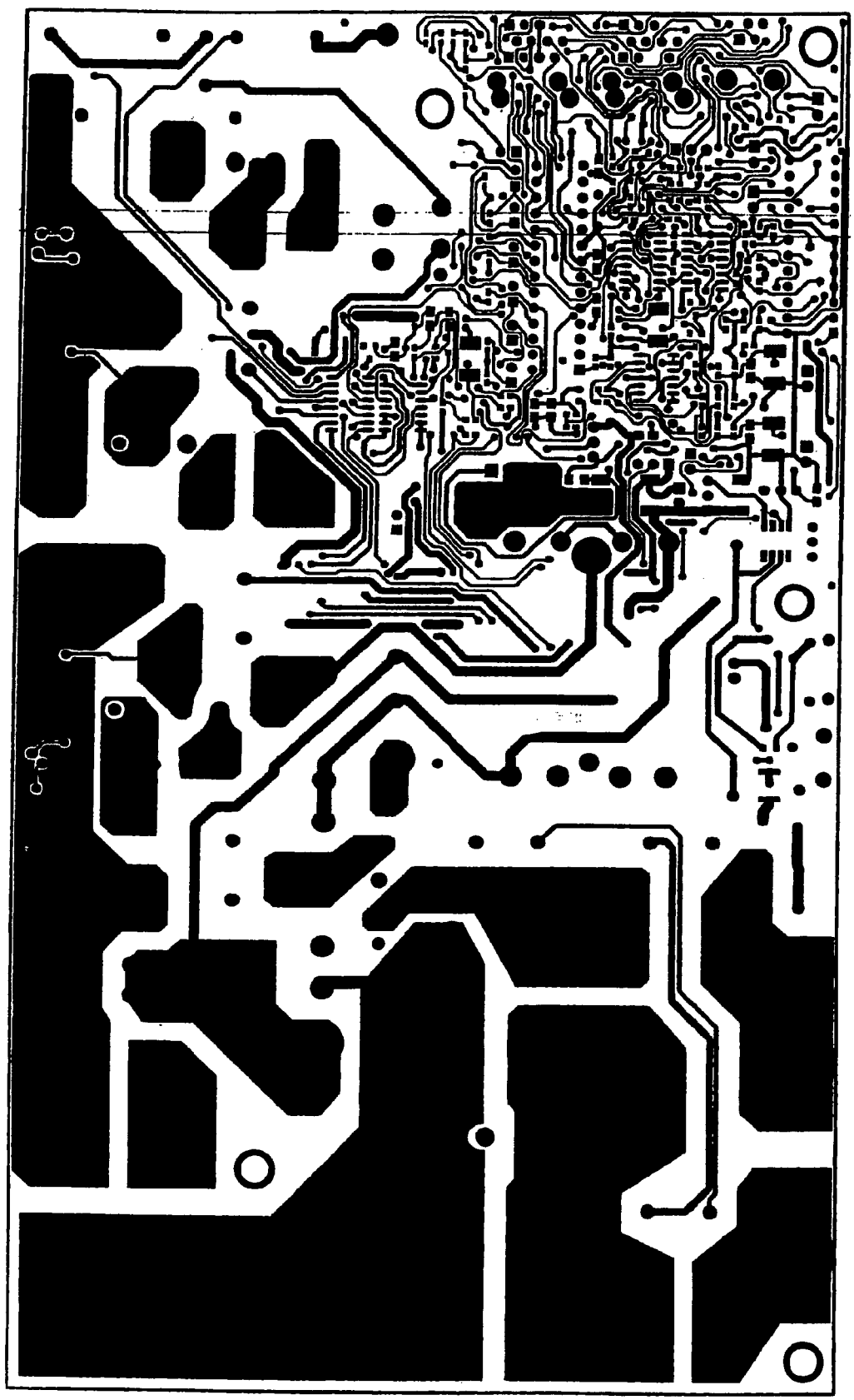
FIG. 8 is a view similar to FIG. 7, but also showing an exemplary low voltage conductor pattern.

FIG. 8 is a view of the conductor pattern on the upper surface 112 of the PCB, similar to FIG. 7 but showing an exemplary low voltage conductor pattern as well.

Figure 9:
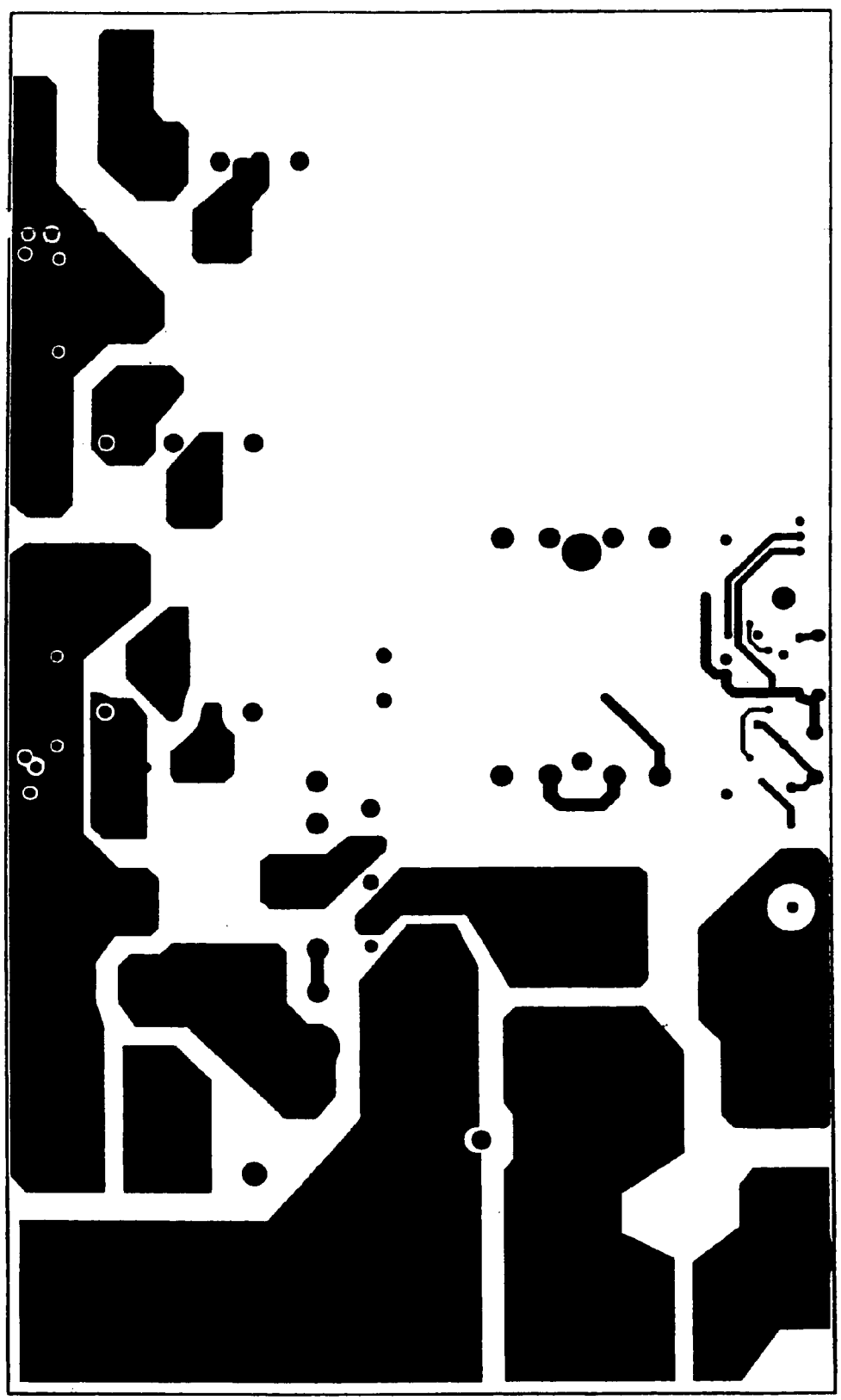
FIG. 9 is a bottom view of the printed circuit board of FIG. 1B, showing an illustrative conductor pattern for a solder side of the board.

FIG. 9 is a view of an exemplary conductor pattern for the lower surface 114 of the PCB, showing the line voltage conductor pattern formed on the lower surface.

Another aspect is the provision of jumper wires and quick connect terminals connected to the "red" supply potential and the "white" supply potential, to allow a given connector to provide either 120V or 240V, as needed in a given installation. A terminal on each line voltage connector 168, 170 and 172 is electrically connected through a PCB conductor to a pad 360, 362, 364 (FIG. 1B) on the surface 112. Each pad is connected to a jumper conductor area 330, 332, 334 (FIG. 7), which is electrically isolated from other areas connected to white, red or black supply potentials. A set 175 (FIG. 1B) of "white" quick connect terminal connectors is electrically connected through a PCB conductor to the "white" conductor area 320. A set 177 (FIG. 1B) of "red" quick connect terminal connectors is electrically connected through a PCB conductor to a "red" conductor area 316. Jumper wires 370, 372, 374 each have one end soldered to the respective pad 360, 362, 364. The other end of the jumper wires each have a mating quick connect connector for connection either to one of the set 175 or 177. The jumper wires provide a means to wire a given wiring connector either for 120V service (by connection to a neutral conductor area) or for 240V service (by connection to a "red" conductor area). By making the jumper wires long enough to reach either set 175, 177, the controller system can be wired up in the field to accommodate either 120V or 240V loads. Thus, the load wiring connectors of the controller system 50 can be readily connected up for either type of load. Alternatively, each connector can be connected to 120V or 240V by a permanent connection provided by a conductor pattern on the PCB.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A controller system for distributing line voltage from a line voltage service to one or more line voltage loads and controlling operation of a service system for a bathing installation such as a spa, comprising:

a housing structure;

a controller printed circuit board mounted within the housing, including a plurality of line voltage output surfaces for connection to respective line voltage loads via line voltage wiring connections, a set of circuit board line voltage contact surfaces, a plurality of circuit conductors for providing circuit connections between the contact surfaces and respective ones of the line voltage output surfaces, wherein the controller circuit board routes line voltage from the circuit board line voltage contact surfaces to the output surfaces;

a line voltage connector structure non-removably mounted on the circuit board, said connector structure having a set of line voltage connectors, each line voltage connector including a connector for connection of a corresponding set of line voltage service conductors and a connector line voltage conductor pin soldered to one of said circuit board line voltage contact surfaces;
a plurality of line voltage load connectors non-removably mounted on the circuit board, each of said line voltage load connectors including a set of terminals for connection to line voltage load wiring and a set of pins soldered to respective ones of the line voltage output surfaces.

2. The system of claim 1 further including:
a plurality of sets of line voltage conductors for connections from the line voltage load connectors to the respective plurality of line voltage loads; and
a strain relief clamp structure integrated with the housing structure for clamping the plurality of sets of line voltage conductors in place.

3. The system of claim 1 further comprising a voltage transformer for transforming the line voltage to low voltage levels mounted on the circuit board, and wherein the printed circuit board includes:
a plurality of low voltage conductors running from the voltage transformer to a plurality of low voltage pads;
at least one low voltage connector structure mounted on the printed circuit board for removable connection to low voltage wiring running to low voltage devices.

4. The system of claim 1 wherein the printed circuit board has mounted thereon a plurality of non-resettable circuit protection devices for providing circuit protection for the line voltage loads.

5. The system of claim 4, wherein the circuit protection devices include fuse devices mounted on the printed wiring board.

6. The controller system of claim 1, wherein the circuit board assembly includes a prefabricated printed wiring board including conductor traces, and the plurality of circuit conductors are defined by a set of said circuit traces.

7. The controller system of claim 1, wherein said line voltage supply is a line voltage supply having a neutral conductor, a first phase conductor and a second phase conductor, and the first phase conductor and the second phase conductor are connected by a corresponding one of said connectors.

8. The controller system of claim 1, further comprising:
a voltage transformer mounted on the printed circuit board for transforming line voltage to low voltage; and
wherein the controller circuit board has mounted thereon a plurality of low voltage switches for selectively applying low voltage to respective low voltage output wiring connections.

9. The system of claim 8, further comprising a microprocessor or microcomputer mounted on the printed circuit board and powered by the low voltage.

10. The system of claim 1, further comprising:
a ground connection terminal block structure mounted to a wall of the housing, including a connector for connecting to an earth ground wire.

11. The system of claim 10, wherein:
the housing structure is fabricated from an electrically conductive material;
the printed circuit board includes one or more conductive ground pads on a lower surface thereof;
the printed circuit board is mounted to the housing structure by one or more electrically conductive stand-off structures which contact the one or more ground pads and a surface of the housing structure, providing electrical continuity between the one or more ground pads and the connector for connecting to an earth ground wire.

12. The system of claim 11, wherein the housing structure includes a first opening through which the earth ground wire is passed from outside the housing structure to inside the housing structure, and a second opening through which the earth ground wire is passed to connect to the connector.

13. The system of claim 1, further comprising:
a plurality of electrically actuated switching devices mounted to the printed circuit board for switching line voltage to the line voltage load contact surfaces, the switching devices controlled by a microprocessor or microcomputer mounted on the circuit board.

14. The system of claim 1, further comprising a jumper wiring arrangement allowing one or more of the line voltage load connectors to be connected to 120V or 240V.

15. The system of claim 1, wherein said housing structure includes a wall, said system further including a strain relief clamp structure integrated with the housing structure for clamping wiring conductors passed through the housing structure and connected to said controller printed circuit board, said strain relief clamping structure comprising:
a wall clamping surface defined in said wall;
a clamp member adapted to be secured to said wall in a clamping position, wherein the wiring conductors are clamped between said clamp member and said wall clamping surface.

16. The system of claim 15, wherein said wall clamping surface is defined along a top edge of said wall.

17. The system of claim 16, wherein said clamp member is mounted for hinged movement between an open position and said clamping position.

18. The system of claim 16, wherein said wall clamping surface comprises a series of channels formed in said top edge to receive wiring conductors, and said clamp member has a series of relieved areas formed along a longitudinal clamp member edge in correspondence with said series of channels.

19. The system of claim 18, wherein each of said series of channels formed in said top edge are sized for a given wiring conductor diameter.

20. The system of claim 18, wherein said series of channels are of a plurality of widths to accommodate wiring conductors of different diameters.

21. The system of claim 1, said controller printed circuit board includes an isolated circuit board line voltage contact surface, and first and second wire connectors, said first wire connector electrically connected to a first one of said line voltage service conductors, said second wire connector electrically connected to a second one of said line voltage conductors, said system further comprising a jumper wire connectable between said first wire connector or said second wire connector.

22. An integrated water heater and controller system for distributing line voltage from a line voltage service to one or more line voltage loads and controlling operation of a service system for a spa, comprising:
a housing structure;
a water heater having a water inlet and a water outlet, said heater attached to said housing structure;
a controller printed circuit board mounted within the housing, including a plurality of line voltage output surfaces for connection to respective line voltage loads including said water heater, a set of circuit board line voltage contact surfaces, a plurality of circuit conductors for providing circuit connections between the contact surfaces and respective ones of the line voltage output surfaces, wherein the controller circuit board routes line voltage from the circuit board line voltage contact surfaces to the output terminals;

a line voltage connector structure non-removably mounted on the circuit board, said connector structure having a set of line voltage connectors, each line voltage connector including a connector for connection of a corresponding set of line voltage service conductors and a connector line voltage conductor pin soldered to a board line voltage contact surface;

a plurality of line voltage load connectors non-removably mounted on the circuit board, each load connector including a set of terminals for connection to line voltage load wiring and a set of pins soldered to respective ones of the line voltage output surfaces; and a microprocessor or microcomputer mounted on the circuit board for controlling operation of the service system including said water heater, said line voltage loads and at least one low voltage device.

23. The system of claim 22 further including:
a plurality of sets of line voltage conductors for connections from the line voltage load connectors to the respective plurality of line voltage loads; and
a strain relief clamp structure integrated with the housing structure for clamping the plurality of sets of line voltage conductors in place.

24. The system of claim 22 further comprising a voltage transformer for transforming the line voltage to low voltage levels mounted on the circuit board, and wherein the printed circuit board includes:
a plurality of low voltage conductors running from the voltage transformer to a plurality of low voltage pads;
at least one low voltage connector structure mounted on the printed circuit board for removable connection to low voltage wiring running to said at least one low voltage device.

25. The system of claim 22 wherein the printed circuit board has mounted thereon a plurality of non-resettable circuit protection devices for providing circuit protection for the line voltage loads.

26. The system of claim 25, wherein the circuit protection devices include fuse devices mounted on the printed wiring board.

27. The system of claim 22, wherein the circuit board assembly includes a prefabricated printed wiring board including conductor traces, and the plurality of circuit conductors are defined by a set of said circuit traces.

28. The system of claim 22, wherein said line voltage supply is a line voltage supply having a neutral conductor, a first phase conductor and a second phase conductor, and the first phase conductor and the second phase conductor are connected by a corresponding one of said connectors.

29. The controller system of claim 22, further comprising:
a voltage transformer mounted on the printed circuit board for transforming line voltage to low voltage; and
wherein the controller circuit board has mounted thereon a plurality of low voltage switches for selectively applying low voltage to respective low voltage output wiring connections.

30. The system of claim 29, wherein said microprocessor or microcomputer is powered by the low voltage.

31. The system of claim 22, further comprising:
a ground connection terminal block structure mounted to a wall of the housing, including a connector for connecting to an earth ground wire.

32. The system of claim 31, wherein:
the housing structure is fabricated from an electrically conductive material;
the printed circuit board includes one or more conductive ground pads on a lower surface thereof;
the printed circuit board is mounted to the housing structure by one or more electrically conductive stand-off structures which contact the one or more ground pads and a surface of the housing structure, providing electrical continuity between the one or more ground pad and the connector for connecting to an earth ground wire.

33. The system of claim 32, wherein the housing structure includes a first opening through which the earth ground wire is passed from outside the housing structure to inside the housing structure, and a second opening through which the earth ground wire is passed to connect to the connector.

34. The system of claim 22, further comprising:
a plurality of electrically actuated switching devices mounted to the printed circuit board for switching line voltage to the line voltage load contact surfaces, the switching devices controlled by said microprocessor or microcomputer.

35. The system of claim 22, further comprising a jumper wiring arrangement allowing one or more of the line voltage load connectors to be connected to 120V or 240V.

36. The system of claim 22, wherein said housing structure includes a wall, said system further including a strain relief clamp structure integrated with the housing structure for clamping wiring conductors passed through the housing structure and connected to said controller printed circuit board, said strain relief clamping structure comprising:
a wall clamping surface defined in said wall;
a clamp member adapted to be secured to said wall in a clamping position, wherein the wiring conductors are clamped between said clamp member and said wall clamping surface.

37. The system of claim 36, wherein said wall clamping surface is defined along a top edge of said wall.

38. The system of claim 37, wherein said clamp member is mounted for hinged movement between an open position and said clamping position.

39. The system of claim 36, wherein said wall clamping surface comprises a series of channels formed in said top edge to receive wiring conductors, and said clamp member has a series of relieved areas formed along a longitudinal clamp member edge in correspondence with said series of channels.

40. The system of claim 39, wherein each of said series of channels formed in said top edge are sized for a given wiring conductor diameter.

41. The system of claim 39, wherein said series of channels are of a plurality of widths to accommodate wiring conductors of different diameters.

42. The system of claim 22, said controller printed circuit board includes an isolated circuit board line voltage contact surface, and first and second wire connectors, said first wire connector electrically connected to a first one of said line voltage service conductors, said second wire connector electrically connected to a second one of said line voltage conductors, said system further comprising a jumper wire connectable between said first wire connector or said second wire connector.

* * * * *